United States Patent
Lee et al.

(10) Patent No.: US 9,443,843 B2
(45) Date of Patent: *Sep. 13, 2016

(54) INTEGRATED CIRCUIT DEVICE

(71) Applicant: VIA TECHNOLOGIES, INC., New Taipei (TW)

(72) Inventors: Sheng-Yuan Lee, New Taipei (TW); Yin-Ku Chang, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,888

(22) Filed: Oct. 29, 2015

(65) Prior Publication Data

US 2016/0148926 A1   May 26, 2016

Related U.S. Application Data

(60) Provisional application No. 62/082,674, filed on Nov. 21, 2014.

(30) Foreign Application Priority Data

Jun. 2, 2015 (TW) .............................. 104117729 A

(51) Int. Cl.
| | | |
|---|---|---|
| *H01L 27/02* | (2006.01) | |
| *H01L 27/07* | (2006.01) | |
| *H01L 49/02* | (2006.01) | |
| *H01L 23/528* | (2006.01) | |
| *H01L 27/06* | (2006.01) | |
| *H01L 29/93* | (2006.01) | |
| *H01L 29/94* | (2006.01) | |
| *H01L 23/522* | (2006.01) | |
| *H01L 27/08* | (2006.01) | |

(52) U.S. Cl.
CPC ......... *H01L 27/0288* (2013.01); *H01L 23/528* (2013.01); *H01L 23/5223* (2013.01); *H01L 23/5225* (2013.01); *H01L 23/5227* (2013.01); *H01L 27/0641* (2013.01); *H01L 27/0788* (2013.01); *H01L 27/0805* (2013.01); *H01L 28/10* (2013.01); *H01L 28/40* (2013.01); *H01L 28/60* (2013.01); *H01L 29/93* (2013.01); *H01L 29/94* (2013.01); *H01L 23/5283* (2013.01)

(58) Field of Classification Search
None
See application file for complete search history.

(56) References Cited

U.S. PATENT DOCUMENTS

| | | | | |
|---|---|---|---|---|
| 6,083,785 A * | 7/2000 | Segawa | ............... | H01L 27/0629 257/E21.008 |
| 6,310,387 B1* | 10/2001 | Seefeldt | ............. | H01L 23/5227 257/531 |
| 6,362,012 B1* | 3/2002 | Chi | ..................... | H01L 23/5223 257/275 |
| 6,815,739 B2* | 11/2004 | Huff | ..................... | B81B 7/0064 257/275 |
| 7,531,407 B2* | 5/2009 | Clevenger | ......... | H01L 21/76898 257/E21.022 |
| 2001/0020875 A1* | 9/2001 | Jansson | ............... | H01L 27/0805 331/44 |
| 2002/0171115 A1* | 11/2002 | Nakatani | ............ | H01L 23/5222 257/499 |

(Continued)

*Primary Examiner* — Evren Seven
(74) *Attorney, Agent, or Firm* — McClure, Qualey & Rodack, LLP

(57) ABSTRACT

The invention provides an integrated circuit device. The integrated circuit device includes a substrate. A first capacitor is disposed on the substrate. A first metal pattern is coupled to a first electrode of the first capacitor. A second metal pattern is coupled to a first electrode of the second capacitor. A third metal pattern is disposed over the first and second metal patterns. The third metal pattern covers the first capacitor, the first metal pattern and the second metal pattern. The third metal pattern is electrically grounding. An inductor is disposed over the third metal pattern.

20 Claims, 7 Drawing Sheets

(56) References Cited

U.S. PATENT DOCUMENTS

| | | | | |
|---|---|---|---|---|
| 2003/0107060 A1* | 6/2003 | Ota | H01L 21/8252 | 257/275 |
| 2005/0098851 A1* | 5/2005 | Nakayama | H01L 27/0805 | 257/528 |
| 2005/0127393 A1* | 6/2005 | Kurokawa | H01L 27/0605 | 257/103 |
| 2006/0114077 A1* | 6/2006 | Mizuno | H01L 21/84 | 333/33 |
| 2006/0197133 A1* | 9/2006 | Jung | H01L 23/5223 | 257/300 |
| 2007/0123015 A1* | 5/2007 | Chinthakindi | H01L 23/5227 | 438/597 |
| 2008/0012097 A1* | 1/2008 | Takahashi | H01L 23/5225 | 257/659 |
| 2008/0153245 A1* | 6/2008 | Lin | H01G 4/228 | 438/381 |
| 2008/0157217 A1* | 7/2008 | Burke | H01L 21/76801 | 257/379 |
| 2008/0237789 A1* | 10/2008 | He | G06F 17/5063 | 257/531 |
| 2009/0108369 A1* | 4/2009 | Chu | H01L 23/5225 | 257/369 |
| 2009/0168293 A1* | 7/2009 | Kim | H01G 4/30 | 361/270 |
| 2009/0179722 A1* | 7/2009 | Goyette | H05K 1/165 | 336/186 |
| 2009/0322446 A1* | 12/2009 | Daley | H01L 23/5222 | 333/185 |
| 2009/0322447 A1* | 12/2009 | Daley | H01L 23/5223 | 333/185 |
| 2010/0072572 A1* | 3/2010 | Baumgartner | H01L 23/5223 | 257/531 |
| 2010/0171194 A1* | 7/2010 | Lin | H01L 23/49816 | 257/531 |
| 2011/0062549 A1* | 3/2011 | Lin | H01L 23/3128 | 257/531 |
| 2011/0068433 A1* | 3/2011 | Kim | H01L 23/552 | 257/531 |
| 2011/0115050 A1* | 5/2011 | Lin | H01L 23/145 | 257/532 |
| 2011/0304012 A1* | 12/2011 | Kim | H01L 21/56 | 257/531 |
| 2012/0075216 A1* | 3/2012 | Black | G02B 26/001 | 345/173 |
| 2012/0161279 A1* | 6/2012 | Lin | H01L 21/561 | 257/531 |
| 2013/0168805 A1* | 7/2013 | Yu | H01L 23/3192 | 257/528 |
| 2014/0001635 A1* | 1/2014 | Chen | H01L 24/11 | 257/751 |
| 2014/0084391 A1* | 3/2014 | Lenive | H01L 23/5389 | 257/414 |
| 2014/0184356 A1* | 7/2014 | Kihara | H01L 27/016 | 333/174 |
| 2014/0319652 A1* | 10/2014 | Lee | H01L 23/5227 | 257/531 |
| 2015/0115404 A1* | 4/2015 | Hsueh | H01L 27/016 | 257/531 |
| 2015/0170816 A1* | 6/2015 | Liu | H01F 21/12 | 327/157 |
| 2015/0333019 A1* | 11/2015 | Lee | H01L 23/564 | 257/508 |

* cited by examiner

INTEGRATED CIRCUIT DEVICE

CROSS REFERENCE TO RELATED APPLICATIONS

This application claims the benefit of U.S. Provisional Application No. 62/082,674 filed Nov. 21, 2014, the entirety of which is incorporated by reference herein. This Application also claims priority of Taiwan Patent Application No. 104117729, filed on Jun. 2, 2015, the entirety of which is incorporated by reference herein.

BACKGROUND OF THE INVENTION

1. Field of the Invention

The present invention relates to an integrated circuit device, and in particular it provides an arrangement for the capacitor of an integrated circuit device with an on-chip inductor.

2. Description of the Related Art

Spiral inductors are widely used in the designs of radio-frequency (RF)/high speed integrated circuit devices. Usually, electric devices are prohibited from being placed in the region occupied by the inductors to prevent the inductors from experiencing crosstalk or any loss of efficiency. Also, the eddy current loss effect and the coupling effect can be reduced. Conventional inductors, however, occupy a considerably large area of the silicon substrate. Therefore, the conventional inductors cause a bottleneck in the fabrication cost of the chips.

Thus, a novel integrated circuit device is desirable.

BRIEF SUMMARY OF THE INVENTION

An integrated circuit device is provided. An exemplary embodiment of an integrated circuit device includes a substrate. A first capacitor is disposed on the substrate. The first capacitor includes a first well doped region extended from a surface of the substrate to a portion of the substrate. A first gate structure is disposed on the first well doped region. A source and a drain respectively positioned on two opposite sides of the first gate structure. The first gate structure serves as the first electrode, the source and the drain serve as the second electrode. A first metal pattern is coupled to a first electrode of the first capacitor. A second metal pattern is coupled to a first electrode of the second capacitor. A third metal pattern is disposed over the first and second metal patterns and covering the first capacitor, the first metal pattern, and the second metal pattern. The third metal pattern is electrically grounding. An inductor is disposed over the third metal pattern.

Another exemplary embodiment of an integrated circuit device includes a substrate. A first well doped region and a second well doped region are disposed on the substrate. A first capacitor is disposed on the first well doped region of the substrate. A second capacitor is disposed on the second well doped region of the substrate. A first metal pattern includes a first metal trace and a second metal trace. The first metal trace and the second metal trace are coupled to a ground node. An inductor is disposed over the first metal pattern. The first metal trace is arranged between the first well doped region of the substrate and the inductor. The second metal trace is arranged between the second well doped region of the substrate and the inductor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
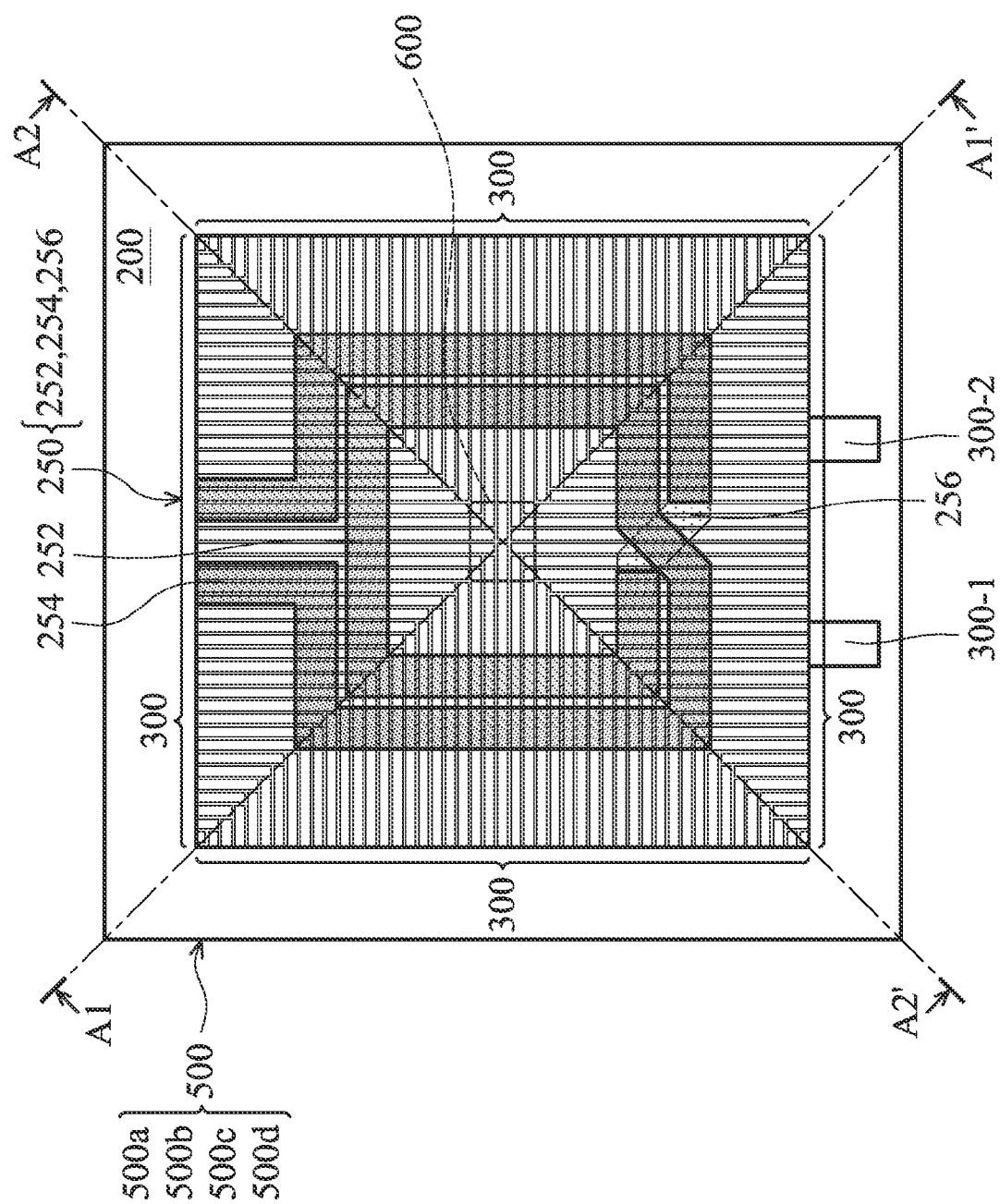
FIG. 1 is a plan-view of an integrated circuit device in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide an integrated circuit device, and in particular provide an arrangement of a capacitor. The integrated circuit device is constructed by disposing a capacitor in a region between an on-chip inductor and a substrate. Also, the capacitor is disposed directly under the ground shield metal patterns, which are used to shield the on-chip-inductor. In some other embodiments, the capacitor may be used as a de-coupling capacitor of a power net.

FIG. 1 is a plan-view of an integrated circuit device 500 in accordance with some embodiments of the disclosure. In some embodiments, the integrated circuit device 500 mainly includes a substrate 200, an inductor 250, a plurality of ground shield metal patterns 300 and at least one capacitor (not shown in FIG. 1). The capacitor would be described using FIGS. 3-7. As shown in FIG. 1, the inductor 250 and the ground shield metal patterns 300 are portions of elements of an interconnection structure (the interconnection structure comprises a plurality metal layers and a plurality of dielectric layers alternatively laminating the metal layers), which is disposed over the substrate 200. Also, the ground shield metal patterns are metal patterns coupled to ground. Additionally, to clearly show the relationship among the positions of the substrate 200, the inductor 250 and ground shield metal patterns 300, the metal layers and the dielectric layers, which are positioned between the inductor 250 and the metal patterns 300, at different layered levels in the interconnection structure are not shown in the figures.

In one embodiment, the substrate 200 may include a silicon substrate, a silicon germanium (SiGe) substrate, a bulk semiconductor substrate, a strained semiconductor substrate, a compound semiconductor substrate, a silicon-on-insulator (SOI) substrate or other commonly used semiconductor substrates. Additionally, in one embodiment, a p-type impurity or an n-type impurity may be implanted onto the substrate 200 to change the conduction type of the substrate 200. In some embodiments, the substrate 200 may include one or more isolation features formed extended from a surface of the semiconductor substrate 200 to a portion of the semiconductor substrate 200. In some embodiments, the isolation features may comprise local oxidation of silicon (LOCOS) features or shallow trench isolation (STI) features. The isolation features may be used to define active regions of the substrate 200.

In one embodiment, the inductor 250 is disposed over the substrate 200. The inductor 250 is formed using the top metal layer (Mtop) of the interconnection structure. Alternatively, the inductor 250 is formed using the top metal layer (Mtop) and the second top metal layer (Mtop−1) of the interconnection structure. As shown in FIG. 1, the inductor may include an inner-ring portion 252 and an outer-ring portion 254, which are parallel to each other and concentrically disposed on the substrate 200. The inner-ring portion 252 and the outer-ring portion 254 may be connected to each other through a connection portion 256. Also, the shapes of the inner-ring portion 252 and the outer-ring portion 254 may include a circular shape, a rectangular shape or a polygonal shape. When the inner-ring portion 252 and the outer-ring portion 254 are formed by the top metal layer (Mtop) of the interconnection structure, the connection portion 256 may be formed by metal strips and via plugs, where in at least one is used to connect to both the top metal layer (Mtop) and the secondary top metal layer (Mtop−1), and the secondary top metal layer (Mtop−1) of the interconnection structure. Alternatively, when the inner-ring portion 252 and the outer-ring portion 254 are formed by the top metal layer (Mtop) and the secondary top metal layer (Mtop−1) of the interconnection structure, the connection portion 256 may be formed by a via plug, which is used to connect to the top metal layer (Mtop) and the secondary top metal layer (Mtop−1).

In one embodiment, the ground shield metal patterns 300 are disposed directly under the inductor 250. The ground shield metal patterns 300 and the inductor 250 respectively belong to different metal layered levels of the interconnection structure. That is to say, the ground shield metal patterns 300 and the inductor 250 occupy different respective metal layered levels of the interconnection structure. In some other embodiments, the ground shield metal patterns 300 and the inductor 250 are separated from each other by at least two metal layers. For example, of the interconnection structures that are formed using seven layers of metal technology, the inductor 250 is formed using the seventh metal layer (M7) and/or the sixth metal layer (M6), and the ground shield metal patterns 300 is formed using the second metal layer (M2), the third metal layer (M3), or the fourth metal layer (M4). In some embodiments, the ground shield metal patterns 300 serve as ground shield metal patterns for the inductor 250. As shown in FIG. 1, the area occupied by the ground shield metal patterns 300 is greater than the area occupied by the inductor 250. Therefore, the boundary of the area occupied by the inductor 250 is positioned within the boundary of the area occupied by the ground shield metal patterns 300.

Figure 2:
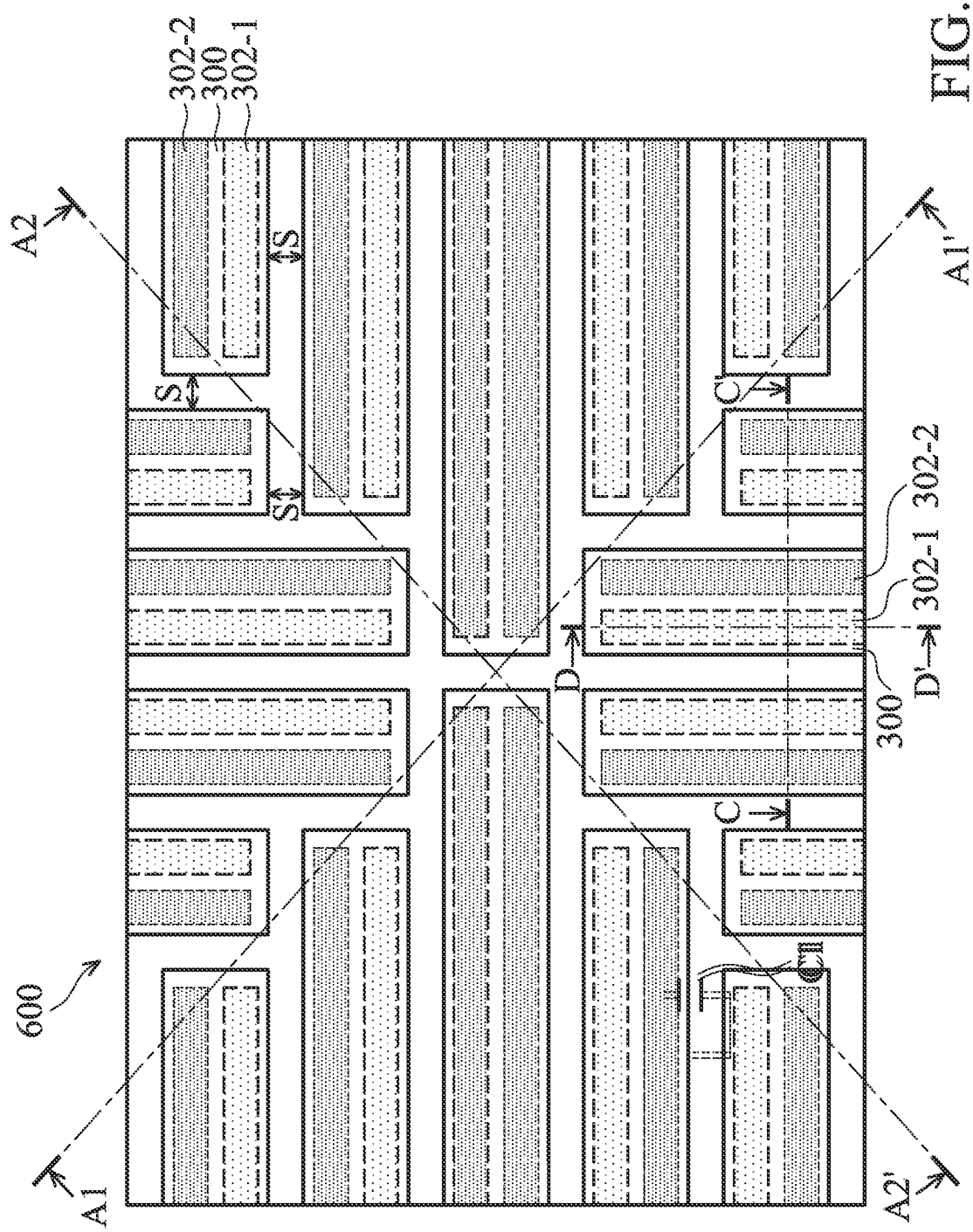
FIG. 2 is an enlarged view of a portion of FIG. 1, showing a layout of ground shield metal patterns, which are disposed under an inductor, and the metal patterns, which are disposed under the ground shield metal patterns and used for coupling electrode of a capacitor, in accordance with some embodiments of the disclosure.

FIG. 2 is an enlarged view of a portion 600 of FIG. 1, showing a layout of ground shield metal patterns and metal patterns, wherein metal patterns are disposed under the ground shield metal patterns and used for coupling electrode of a capacitor, in accordance with some embodiments of the disclosure. As shown in FIG. 2, the shapes of the ground shield metal patterns 300 are metal strips (or traces) are substantially the same. Please refer to FIGS. 1 and 2, the diagonal line A1-A1' and the diagonal line A2-A2', which cross opposite corners of the inductor 250, may divide the area occupied by ground shield metal patterns 300 into four regions. The ground shield metal patterns 300 positioned in one of the regions are separated from those in another of the regions, so that the coupling effect can be reduced. Also, the ground shield metal patterns 300 positioned in each of the regions are disposed parallel to one another and separated by a single space S. Additionally, the ground shield metal patterns 300 positioned in one of the regions are arranged substantially perpendicular to the ground shield metal patterns 300 positioned in the adjacent regions. The ground shield metal patterns 300 positioned in one of the regions are arranged separated from ground shield metal patterns 300 positioned in one of the regions are arranged by the space S. Therefore, the ground shield metal patterns 300 positioned in the opposite regions don't connect to one another. In one embodiment, the ground shield metal patterns 300 may connect to one another ground shield metal patterns through metal connection portions 300-1 and 300-2, and are coupled to the individual ground node or the ground node of the power net, wherein metal connection portions 300-1 and 300-2 are positioned in the same layered level. That is to say, the ground shield metal patterns 300 are coupled to ground. The metal connection portions 300-1 and 300-2 may have ring-shaped portions, which extend substantially along the outer boundary of the metal patterns 300, to connect the ground shield metal patterns 300. The ground shield metal patterns 300 may electrically isolated the inductor 250 from the substrate 200, so that the eddy current loss effect can be avoided. Also, problems such as crosstalk and coupling problems that can occur between the inductor 250 and other electrical devices disposed on the substrate 200 can be avoided.

To those skilled in the art, various modifications of the ground shield metal patterns 300 in accordance with some embodiments of the disclosure are allowed. Therefore, the ground shield metal patterns may cut the eddy current generated from the induced magnetic field of the inductor 250 and along a direction that is perpendicular to the eddy current, the effect of the eddy current may be reduced, and the quality factor (Q) of the inductor 250 can be improved.

Figure 3:
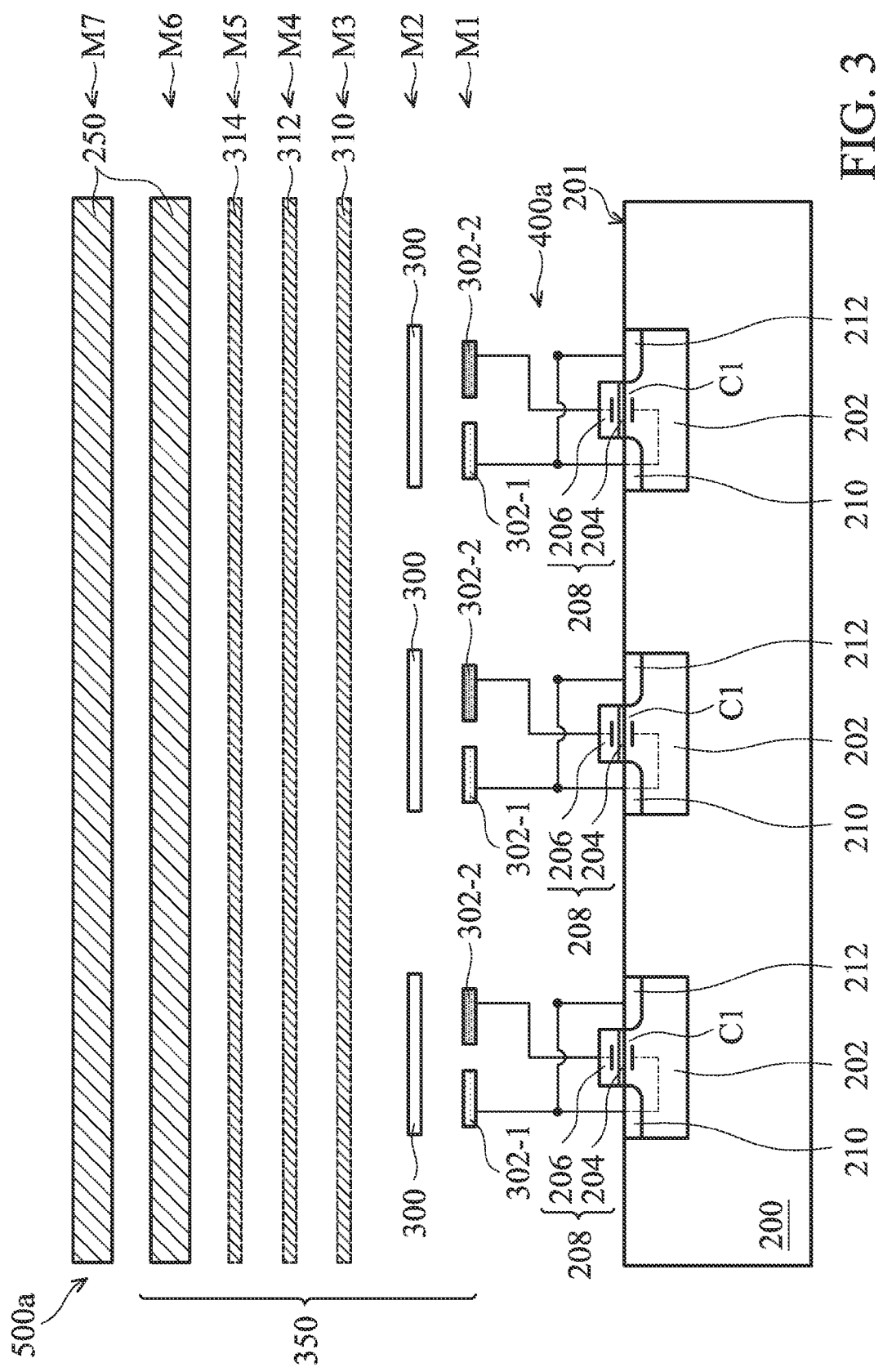
FIG. 3 is a cross-sectional view along a line C-C' of FIG. 2, showing several metal-oxide-semiconductor (MOS) capacitors disposed under different ground shield metal patterns in accordance with some embodiments of the disclosure.
Figure 4:
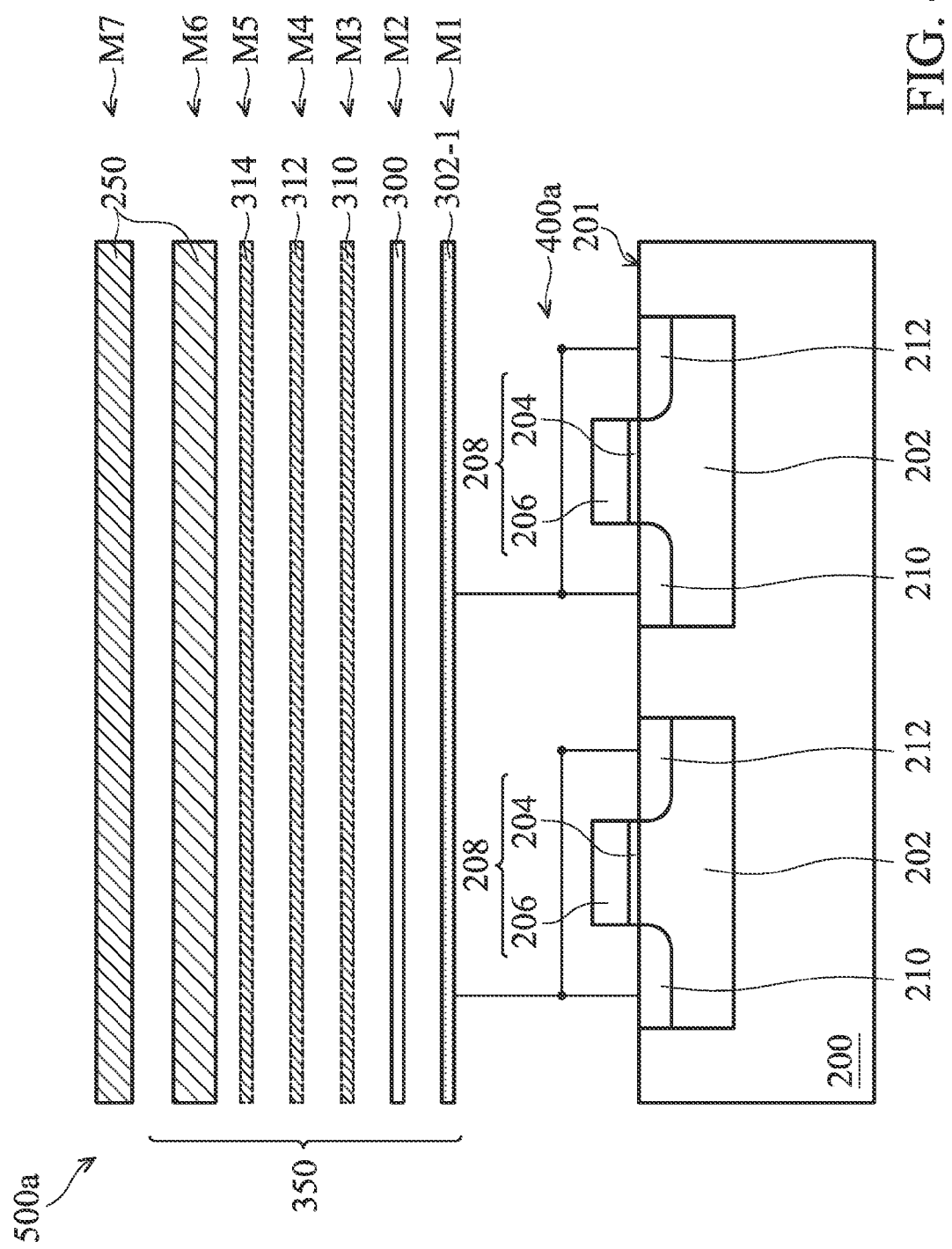
FIG. 4 is a cross-sectional view along a line D-D' of FIG. 2, showing several metal-oxide-semiconductor (MOS) capacitors disposed under a single ground shield metal pattern in accordance with some embodiments of the disclosure.

Next, FIGS. 3-4 are illustrated to describe cross-sectional views of an integrated circuit device 500a in accordance with one embodiment of the disclosure. The integrated circuit device 500a includes a metal-oxide-semiconductor (MOS) capacitor 400a, which is disposed directly under the inductor and the ground shield metal patterns 300. FIG. 3 is a cross-sectional view along a line C-C' of FIG. 2, and FIG. 3 is a cross-sectional view along a line D-D' of FIG. 2. Also, the cross-sectional view shown in FIG. 3 illustrates several metal-oxide-semiconductor (MOS) capacitors 400a disposed under different ground shield metal patterns in accordance with some embodiments of the disclosure. The cross-sectional view shown in FIG. 4 illustrates several metal-oxide-semiconductor (MOS) capacitors 400a disposed under a single ground shield metal pattern in accordance with some embodiments of the disclosure. To clearly show the relationship among of the layered levels of the inductor, ground shield metal patterns 300, the metal layers and the conductive lines, and the relationship between of the layered levels of the MOS capacitor 400a and the substrate 200, the metal layers at various layered levels (including the inductor 250) of the interconnection structure are additionally drawn. Also, the position of the interconnection structure 350 is illustrated in FIGS. 3-4.

As shown in FIGS. 3-4, in one embodiment, the MOS capacitor 400a is disposed on the p-type substrate 200, and positioned directly under the ground shield metal patterns 300. The MOS capacitor 400a includes a well doped region 202, a gate structure 208, a source 210 and a drain 212. The well doped region 202 is formed extending from a surface 201 of the substrate to a portion of the substrate 200. Also, the well doped region 202 is doped with the p-type impurity material. In some embodiments, the well doped region 202 may be electrically floating. The gate structure 208 of the MOS capacitor 400a is disposed on the well doped region 202. The gate structure 208 includes a gate oxide layer 204 and a gate 206 disposed on the gate oxide layer 204. The source 210 and the drain 212 are respectively formed on the well doped region 202 and extending from the surface 201 of the substrate to a portion of the substrate 200. The source 210 and the drain 212 are formed on two opposite sides of the gate structure 208. The source 210 and the drain 212 are doped with the n-type impurity material. In some embodiments, the gate structure 208 serves as one electrode of the MOS capacitor 400a, the source 210 and the drain 212 collectively serve as another electrode of the MOS capacitor 400a.

Base on the description of the aforementioned embodiments, a metal-oxide-semiconductor (MOS) varactor or a p-type MOS capacitor can be disposed on the substrate 200 and positioned directly under the ground shield metal patterns 300 to achieve the similar technological effect, in accordance with another embodiment of the disclosure.

In the conventional semiconductor technology, the isolation regions, which are formed using the shallow trench isolation (STI) technology, are arranged between well doped regions with different conduction types to block the leakage current between the well doped regions. Additionally, the well doped regions are formed using the ion implantation process and the diffusion process in the semiconductor technology in common use. The uniformity of the ion (impurity) concentration in the well doped regions, however, is hard to control using conventional semiconductor technology. Especially, the ion concentration at the edge of the well doped region is greater than that in other regions of the well doped region. Therefore, the performance of the transistor, which is formed at the edge of the well doped region, is different from that formed in other regions of the well doped region and is defined as the well proximity effect. In the conventional technology, a transistor of the same type may be arranged in the same well doped region to reduce the well proximity effect and to optimize the layout area.

Please refer to FIG. 3 again, in which the boundaries of the well doped region 202 of the MOS capacitor 400a, which are disposed directly under the different ground shield metal patterns 300, may be respectively aligned to the boundaries of the ground shield metal patterns 300 or positioned outside the boundaries of the ground shield metal patterns 300. It should be noted that the well doped regions 202 of the different MOS capacitors 400a, which are positioned under the different ground shield metal patterns 300, are separated from each other to ensure the ground shield effect of the ground shield metal patterns 300 to the MOS capacitors 400a. Additionally, the extending direction of the gate 206, the source 210 and the drain 212 shown in FIG. 3 may substantially be parallel to that of the ground shield metal patterns 300. It should be noted that the p-type well doped region 202 is covered by the ground shield metal patterns 300, and the substrate 200 is positioned in the region without being covered by the ground shield metal patterns 300 in the view along the projection direction of the inductor 250 to the substrate 200.

Please refer to FIG. 4 again, wherein in another embodiment, the extending direction of the gate 206, the source 210 and the drain 212 of each of the MOS capacitors 400a may substantially be parallel to that of the ground shield metal patterns 300. The well doped regions 202 of different MOS capacitors 400a, which are also disposed directly under the same ground shield metal pattern 300, may be separated from or connecting to each other. Alternatively, several individual MOS capacitors 400a may be positioned directly under a single metal pattern 300.

Please refer to FIGS. 2-4 again, the ground shield metal patterns 300 and the inductor 250 may be separated by two or more of the metal layers therebetween. As shown in FIGS. 3 and 4, for example, the ground shield metal patterns 300 are formed by the second metal layer (M2), and the inductor 250 is formed by the sixth metal layer (M6) and the seventh metal layer (M7). The ground shield metal patterns 300 and the inductor 250 are separated by three metal layers, which include the metal layer 310 formed by the third metal layer (M3), the metal layer 312 formed by the fourth metal layer (M4) and the metal layer 314 formed by the fifth metal layer (M5). Also, no routing (conductive line) is arranged in the projection areas of the ground shield metal patterns 300 and the inductor 250 to the metal layer 310 (M3), the metal layer 312 (M4) and the metal layer 314 (M5). Additionally, at least two metal patterns 302-1 and 302-2, which are parallel to each other, can be positioned directly under the ground shield metal patterns 300. The metal patterns 302-1 and 302-2 are coupled to the two respective electrodes of the MOS capacitor 400a. For example, the metal pattern 302-1 is coupled to both the source 210 and the drain 212 of the MOS capacitor 400a, and the metal pattern 302-2 is coupled to the gate 206 of the MOS capacitor 400a. The metal patterns 302-1 and 302-2 may serve as the conductive wires of the electrodes of the MOS capacitor 400a. The metal pattern 302-1 is coupled to a ground node of a power net or the ground shield metal patterns (metal patterns) 300. The metal pattern 302-2 is coupled to the power node of the power net. That is to say, the metal pattern 302-1 is coupled to ground. As shown in FIG. 3, the equivalent capacitance of the MOS capacitor 400a is leveled as C1.

Base on the description of the aforementioned embodiments, in another embodiment, the inductor 250 may be also formed by the sixth metal layer (M6), the seventh metal layer (M7), the metal layer 310 formed by the third metal layer (M3), the metal layer 312 formed by the fourth metal layer (M4) and the metal layer 314 formed by the fifth metal layer (M5). Therefore, the number of turns of the inductor can be three or more.

Please refer to FIGS. 2-4 again, the layered level of the metal pattern 302-1 is the same as that of the metal pattern 302-2 in some embodiments of the disclosure. The metal patterns 302-1 (or 302-2) and ground shield metal patterns 300 occupy different respective metal layers of the interconnection structure 350. The ground shield metal patterns 300 and the metal patterns 302-1 and 302-2 are separated from one another through the dielectric layers (not shown) of the interconnection structure 350 and parallel to one another. For example, when the ground shield metal patterns 300 are formed by the second metal layer (M2), the metal patterns 302-1 and 302-2 can be formed by the first metal layer (M1). Also, the MOS capacitor 400a is positioned directly under the metal patterns 302-1 and 302-2. The shapes (profiles) of the metal patterns 302-1 and 302-2 are similar to that of the corresponding metal patterns. For example, the metal patterns 302-1, 302-2 may be metal strips, which have a shape that is the same as or similar to the shape of the corresponding ground shield metal patterns 300. Furthermore, the width of the metal patterns 302-1 and 302-2 can be designed to be less than half of the width of the corresponding ground shield metal patterns 300. Therefore, a boundary of the metal pattern 302-1 and a boundary of the metal pattern 302-2 are respectively positioned within a boundary of the corresponding ground shield metal patterns 300 in a plane view (FIG. 2). That is to say, the metal patterns 302-1 and 302-2 are respectively covered by the corresponding ground shield metal patterns 300 in the plane view to ensure the ground shield effect of the ground shield metal patterns 300 to the corresponding metal patterns 302-1 and 302-2 and the MOS capacitor 400a without being affected by the inductor 250.

Figure 5:
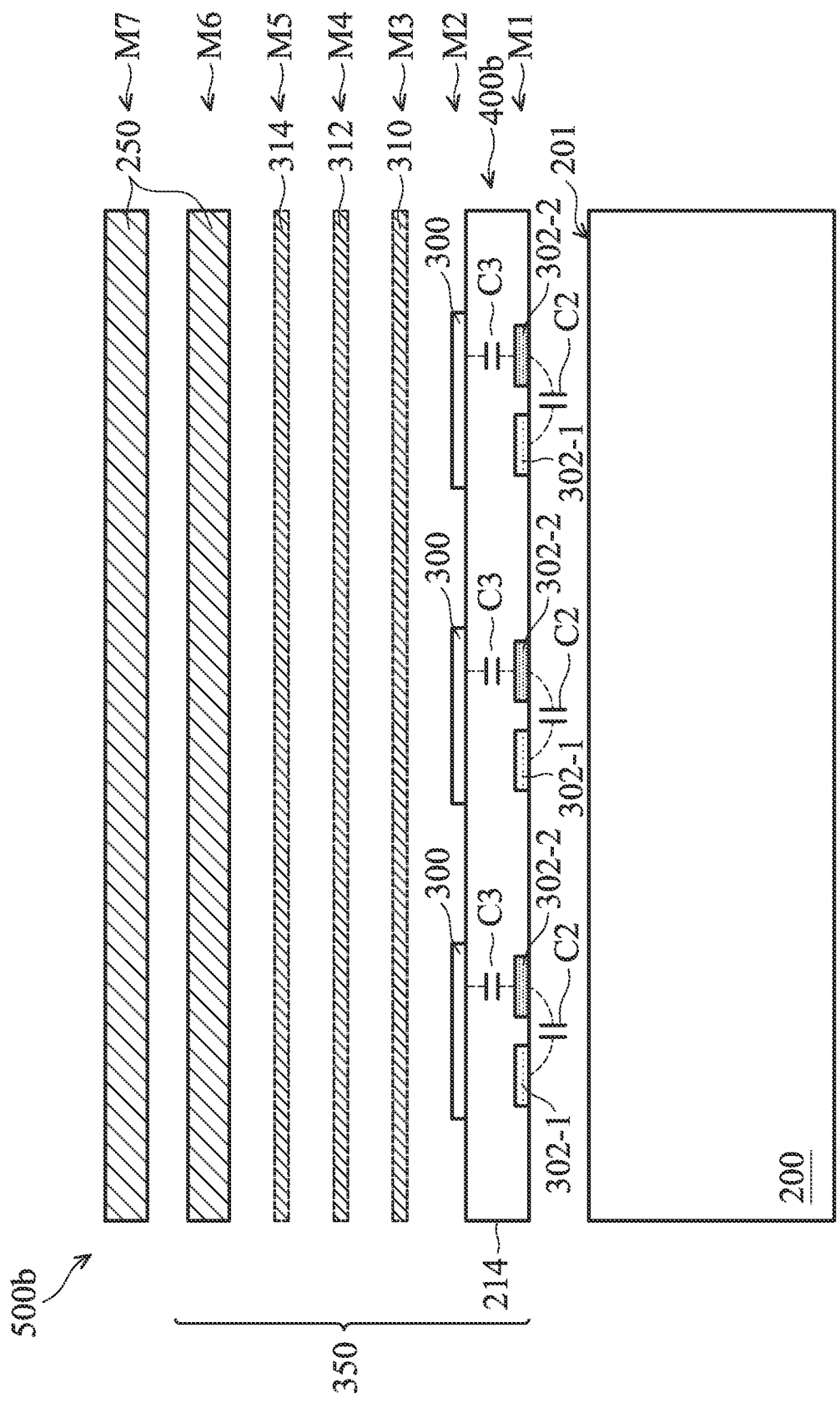
FIG. 5 is a cross-sectional view along a line C-C' of FIG. 2, showing several metal-oxide-metal (MOM) capacitors disposed under different ground shield metal patterns in accordance with some embodiments of the disclosure.

FIG. 5 is a cross-sectional view along a line C-C' of FIG. 2, showing an integrated circuit device 500b in accordance with another embodiment of the disclosure. The integrated circuit device 500b includes several metal-oxide-metal (MOM) capacitors 400b disposed under different ground shield metal patterns. Elements of the embodiments hereinafter, that are the same or similar as those previously described with reference to FIGS. 1-4, are not repeated for brevity.

As shown in FIG. 5, in one embodiment, a metal-oxide-metal (MOM) capacitor 400b is disposed on the substrate 200. The MOM capacitor 400b mainly includes ground shield metal patterns 300, metal patterns 302-1, 302-2, and an oxide layer 214, which is disposed among the ground shield metal patterns 300, and metal patterns 302-1, 302-2. The oxide layer 214 may be a dielectric layer of the interconnection structure 350. Additionally, the layered level of the metal pattern 302-1 is the same as that of the metal pattern 302-2. The layered level occupied by the metal patterns 302-1 and 302-2 is next to that occupied by the ground shield metal patterns 300. For example, when the ground shield metal patterns 300 are formed by the second metal layer (M2), the metal patterns 302-1 and 302-2 can be formed by the first metal layer (M1). In some other embodiments, the metal patterns 302-1 and 302-2 may be separated from the ground shield metal patterns 300 through two or more oxide layers, which are laminated vertically. It should be noted that the oxide layers used to separate the metal patterns 302-1 and 302-2 from the ground shield metal patterns 300 don't include any metal patterns embedded therein. In one embodiment, the metal patterns 302-1 and 302-2 may serve as electrodes of the MOM capacitor 400b. The metal pattern 302-1 is coupled to a ground node of a power net or the ground shield metal patterns 300. The metal pattern 302-2 is coupled to the power node of the power net. That is to say, the metal pattern 302-1 is coupled to ground. As shown in FIG. 5, the equivalent capacitance of the MOM capacitor 400b is the sum of the equivalent capacitance of a capacitor between the metal patterns 302-1 and 302-2, which is leveled as C2, and the equivalent capacitance of a capacitor between the metal patterns 302-2 and 300, which is leveled as C3.

Figure 6:
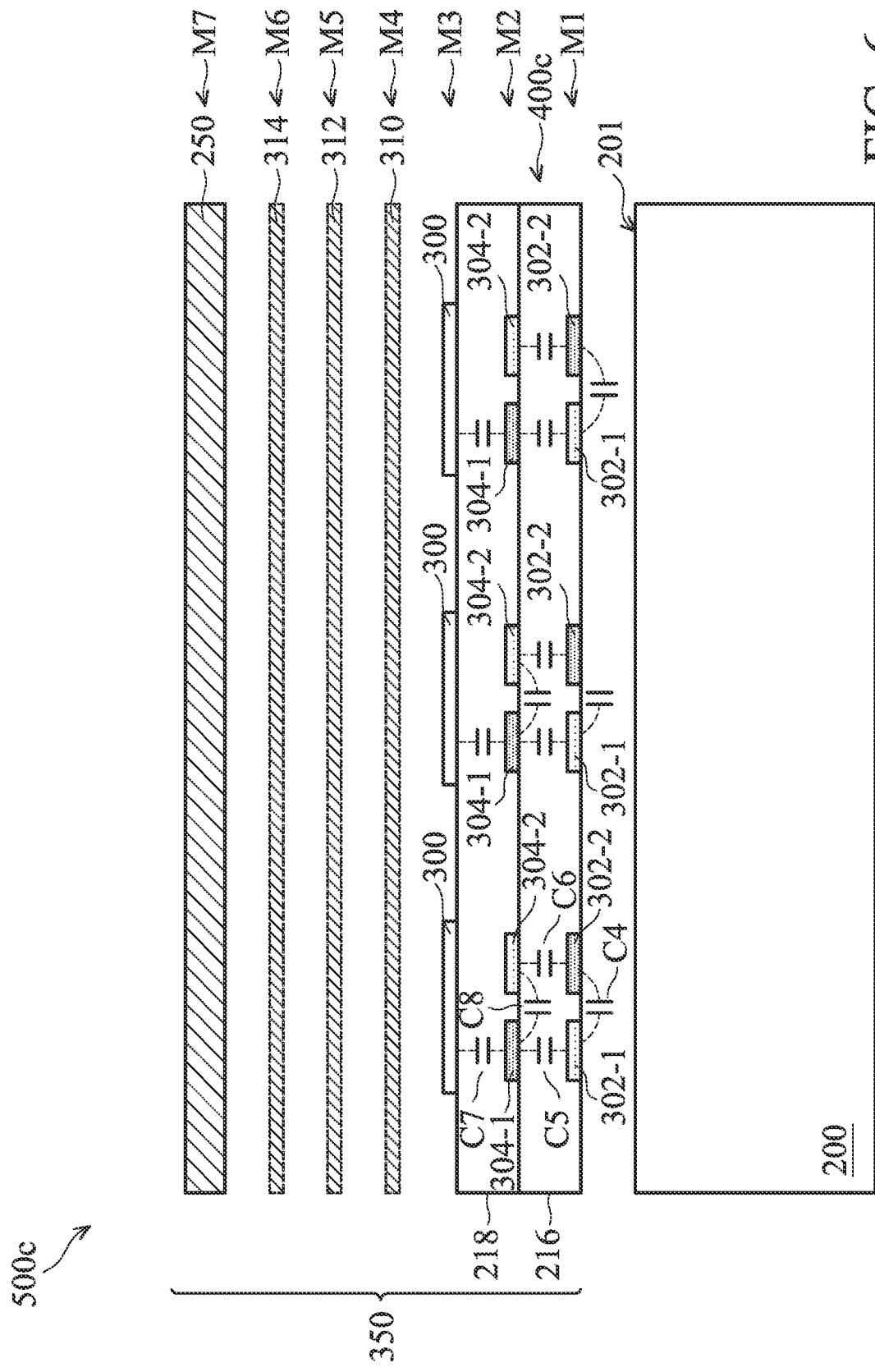
FIG. 6 is a cross-sectional view along a line C-C' of FIG. 2, showing several metal-oxide-metal (MOM) capacitors disposed under different ground shield metal patterns in accordance with some other embodiments of the disclosure.

FIG. 6 is a cross-sectional view along a line C-C' of FIG. 2, showing an integrated circuit device 500c in accordance with another embodiment of the disclosure. The integrated circuit device 500c includes several metal-oxide-metal (MOM) capacitors 400c disposed under different ground shield metal patterns. Elements of the embodiments hereinafter, that are the same or similar as those previously described with reference to FIGS. 1-5, are not repeated for brevity. One of the differences between the integrated circuit device 500c in FIG. 6 and the integrated circuit device 500b in FIG. 5 is that the integrated circuit device 500c includes metal patterns 304-1 and 304-2 and oxide layers 216 and 218. The metal patterns 304-1 and 304-2 are disposed between the ground shield metal patterns 300 and the metal patterns 302-1 and 302-2. The oxide layer 216 is disposed between the metal patterns 304-1 and 304-2 and the metal patterns 302-1 and 302-2. The oxide layer 218 is disposed between the metal patterns 304-1 and 304-2 and the ground shield metal patterns 300. The oxide layers 216 and 218 may both belong to a dielectric layer of the interconnection structure 350. Additionally, the metal patterns 302-1 and 302-2 may both belong to the same layered level of metal of the interconnection structure 350. The metal patterns 304-1 and 304-2 may both belong to the same layered level of metal of the interconnection structure 350. The metal patterns 302-1 and 302-2 are positioned in the layered level different to the layered levels of the metal patterns 304-1 and 304-2 and the ground shield metal patterns 300. For example, when the ground shield metal patterns 300 are formed by the third metal layer (M3), the metal patterns 304-1 and 304-2 can be formed by the second metal layer (M2), and the metal patterns 302-1 and 302-2 can be formed by the first metal layer (M1). In some other embodiments, the metal patterns 304-1 and 304-2 may be separated from the ground shield metal patterns 300, 302-1 and 302-2 through two or more oxide layers, which are laminated vertically. It should be noted that the oxide layer does not include any metal patterns embedded therein.

In this embodiment, the metal patterns 302-1, 302-2, 304-1 and 304-2 may serve as electrodes of the MOM capacitor 400c. Also, the adjacent metal patterns of the metal patterns 302-1, 302-2, 304-1 and 304-2 are coupled to different respective nodes. For example, the metal pattern 302-1 is coupled to the ground node of the power net or the ground shield metal patterns 300. The metal patterns 302-2 and 304-1, which are adjacent to the metal pattern 302-1, are coupled to the power node. Also, the metal pattern 304-2, which is adjacent to the metal patterns 302-2 and 304-1, is coupled to the ground node. That is to say, the metal patterns 302-1 and 304-2 are coupled to ground. As shown in FIG. 6, the equivalent capacitance of the MOM capacitor 400c is the sum of the equivalent capacitance of a capacitor between the metal patterns 302-1 and 302-2, which is leveled as C4, the equivalent capacitance of a capacitor between the metal patterns 302-1 and 304-1, which is leveled as C5, the equivalent capacitance of a capacitor between the metal patterns 302-2 and 304-2, which is leveled as C6, the equivalent capacitance of a capacitor between the metal patterns 304-1 and 300, which is leveled as C7, and the equivalent capacitance of a capacitor between the metal patterns 304-1 and 304-2, which is leveled as C8.

Figure 7:
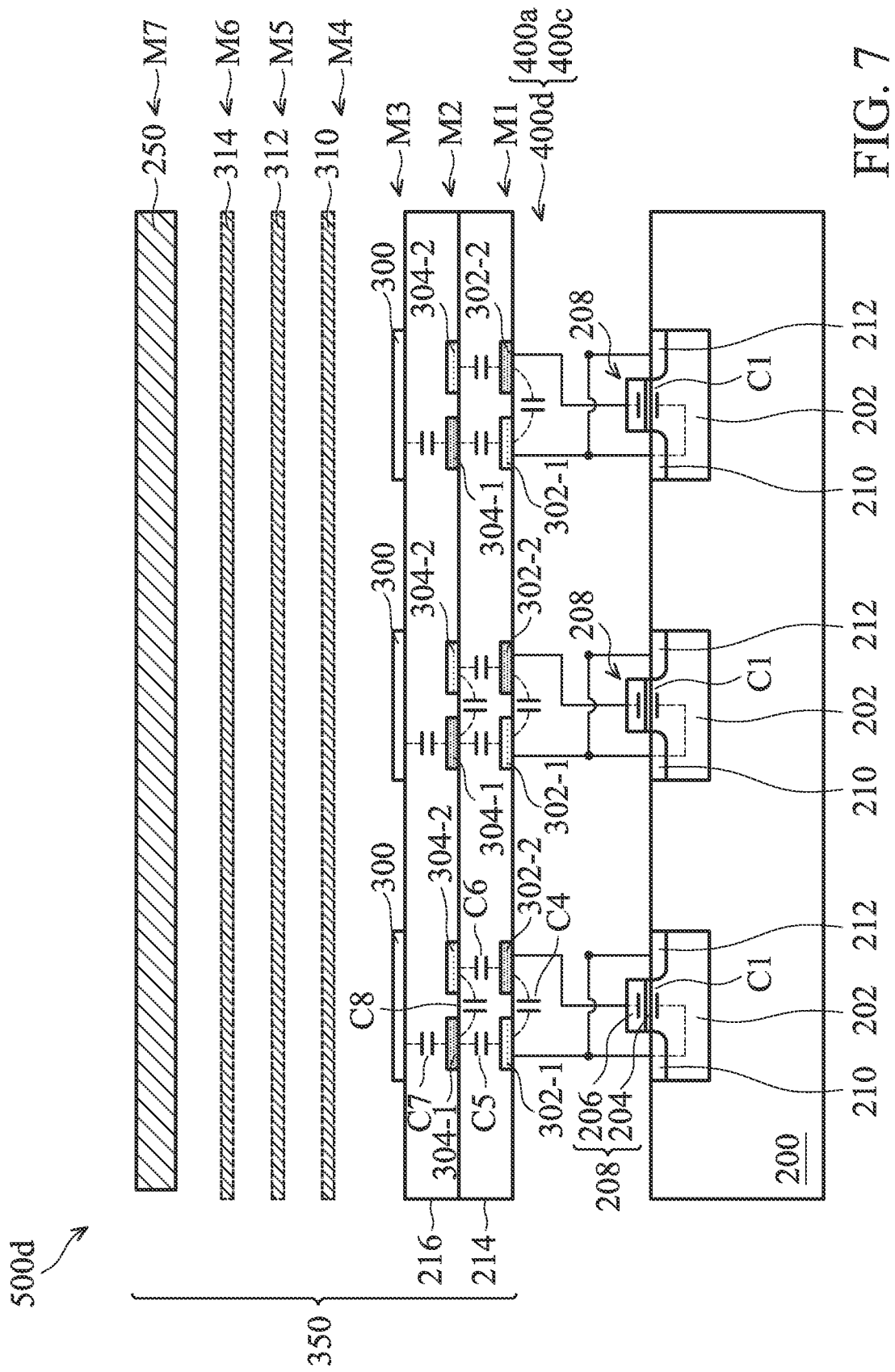
FIG. 7 is a cross-sectional view along a line C-C' of FIG. 2, showing several metal-oxide-semiconductor (MOS) capacitors and metal-oxide-metal (MOM) capacitors disposed under different ground shield metal patterns in accordance with some other embodiments of the disclosure.

FIG. 7 is a cross-sectional view along a line C-C' of FIG. 2, showing an integrated circuit device 500d in accordance with another embodiment of the disclosure. One of the differences between the integrated circuit device 500d in FIG. 7 and the integrated circuit device 500c in FIG. 6 is that the integrated circuit device 500d includes several MOM capacitors 400c, which are disposed under the different ground shield metal patterns, and the MOS capacitor 400a, which is disposed under the MOM capacitors 400c. Elements of the embodiments hereinafter, that are the same or similar as those previously described with reference to FIGS. 1-6, are not repeated for brevity. In this embodiment, the metal patterns 302-1, 302-2, 304-1 and 304-2 may serve as electrodes of the MOM capacitor 400c. The metal patterns 302-1 and 302-2 may serve as electrodes of the MOS capacitor 400a. Also, the adjacent metal patterns of the metal patterns 302-1, 302-2, 304-1 and 304-2 are coupled to different respective nodes. For example, the metal pattern 302-1 is coupled to the ground node of the power net or the ground shield metal patterns 300. The metal patterns 302-2 and 304-1, which are adjacent to the metal pattern 302-1, are coupled to the power node. Also, the metal pattern 304-2, which is adjacent to the metal patterns 302-2 and 304-1, is coupled to the ground node. As shown in FIG. 7, the equivalent capacitance of the integrated circuit device 500d is the sum of the equivalent capacitance of the MOM capacitor 400c and the MOS capacitor 400a.

Embodiments provide an integrated circuit device. The integrated circuit device is constructed by disposing a metal-oxide-semiconductor (MOS) capacitor and/or a metal-oxide-metal (MOM) capacitor directly under an on-chip-inductor. The MOS capacitor and/or the MOM capacitor is positioned in a region between ground shield metal patterns, which are used to shield the on-chip-inductor, and a substrate. Also, the MOS capacitor uses two parallel metal patterns, which are positioned directly under the ground shield metal patterns and between the MOS capacitor and the ground shield metal patterns, as the conductive lines of the electrodes to couple to the two respective electrodes of the MOS capacitor. Also, the two parallel metal patterns are coupled to a ground node and a power node of a power net, respectively. The MOM capacitor is composed of at least two metal patterns and an oxide layer therebetween of the interconnection structure. The metal patterns may serve as the two electrodes of the MOM capacitor, and may be coupled to the ground node (or the ground shield metal patterns) and the power node of the power net, respectively. The equivalent capacitance of the MOM capacitor 400c includes the capacitance of the capacitor, which is composed of the two metal patterns and the oxide layer therebetween, and the capacitance of the capacitors, which is composed of the two metal patterns, the ground shield metal patterns and the oxide layer. In some embodiments, the arrangement of the capacitor may reduce the area of the circuit layout. The arrangement of the capacitor also can be integrated with the semiconductor processes without increasing the cost or requiring any additional steps in the fabrication process. Additionally, the capacitor disposed directly under the on-chip inductor may be used as a de-coupling capacitor of the power net. Because the operation frequency of the de-coupling capacitor is much less than that of the on-chip-inductor, the other integrated circuit devices can be free from interference from the capacitor (the de-coupling capacitor).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit device, comprising:
   a substrate;
   a first capacitor disposed on the substrate;
   a first metal pattern coupled to a first electrode of the first capacitor;
   a second metal pattern coupled to a second electrode of the first capacitor;
   a third metal pattern disposed over the first and second metal patterns and covering the first capacitor, the first metal pattern, and the second metal pattern, wherein the third metal pattern is coupled to ground; and
   an inductor disposed over the third metal pattern,
   wherein the first capacitor comprises:
   a first oxide layer disposed among the first, second, and third metal patterns, wherein the first metal pattern serves as the first electrode of the first capacitor, the second metal pattern serves as the second electrode of the first capacitor.

2. The integrated circuit device as claimed in claim 1, further comprising:
   a plurality of metal layers disposed on the substrate, wherein the third metal pattern and the first metal pattern respectively occupy different metal layers of the metal layers, and wherein the third metal pattern and the second metal pattern respectively occupy different metal layers of the metal layers.

3. The integrated circuit device as claimed in claim 1, wherein the third metal pattern is disposed directly under the inductor, wherein the first metal pattern and the second metal pattern are disposed directly under the third metal pattern, and wherein a boundary of the first metal pattern and a boundary of the second metal pattern are respectively positioned within a boundary of the third metal pattern in a plane view.

4. The integrated circuit device as claimed in claim 1, wherein the first, second, and third metal patterns are separated from and parallel to one another.

5. The integrated circuit device as claimed in claim 1, wherein the first capacitor is a first metal-oxide-metal (MOM) capacitor.

6. The integrated circuit device as claimed in claim 1, wherein the first metal pattern and the second metal pattern belong to a first metal layered level, the third metal pattern belongs to a second metal layered level, which is different from the first metal layered level.

7. The integrated circuit device as claimed in claim 1, wherein the first metal pattern belongs to a first metal layered level, the second metal pattern belongs to a second metal layered level, and the third metal pattern belongs to a third metal layered level, wherein the first, second, and third metal layered levels are different from one another.

8. The integrated circuit device as claimed in claim 1, further comprising:
   a second capacitor disposed between the substrate and the third metal pattern.

9. The integrated circuit device as claimed in claim 8, wherein the second capacitor is a metal-oxide-semiconductor (MOS) varactor.

10. The integrated circuit device as claimed in claim 9, wherein the second capacitor is a first metal-oxide-semiconductor (MOS) capacitor, and the first metal-oxide-semiconductor (MOS) capacitor comprises:
   a first well doped region extended from a surface of the substrate to a portion of the substrate;
   a first gate structure disposed on the first well doped region; and
   a source and a drain respectively positioned on two opposite sides of the first gate structure, wherein the first gate structure serves as the first electrode, the source and the drain serve as the second electrode.

11. The integrated circuit device as claimed in claim 10, wherein the first well doped region is formed by doping an impurity within the substrate.

12. The integrated circuit device as claimed in claim 11, wherein the impurity is a p-type impurity or an n-type impurity.

13. The integrated circuit device as claimed in claim 10, further comprising:
   a third capacitor disposed between the substrate and the third metal pattern.

14. The integrated circuit device as claimed in claim 13, wherein the third capacitor is a second metal-oxide-semiconductor (MOS) capacitor, which is positioned parallel to the first metal-oxide-semiconductor (MOS) capacitor, wherein a second well doped region of the second metal-oxide-semiconductor (MOS) capacitor is separated from the first well doped region.

15. The integrated circuit device as claimed in claim 14, wherein the third metal pattern comprises a first metal trace and a second metal trace, and the first metal trace fully covers the first well doped region, and the second metal trace fully covers the second well doped region in a plane view.

16. The integrated circuit device as claimed in claim 15, wherein the substrate is exposed to a region positioned between the first and second metal traces.

17. The integrated circuit device as claimed in claim 1, further comprising;
   a fourth metal pattern between the first metal pattern and the third metal pattern;
   a fifth metal pattern between the second metal pattern and the third metal pattern; and
   the first oxide layer disposed among the first, second, third, fourth and fifth metal patterns, wherein the first and fifth metal patterns serve as the first electrode of the first capacitor, the second and fourth metal patterns serve as the second electrode of the first capacitor.

18. The integrated circuit device as claimed in claim 17, further comprising:
   a plurality of metal layers disposed on the substrate, wherein the third metal pattern, the first metal pattern and the fourth metal pattern respectively occupy different metal layers of the metal layers, and wherein the third metal pattern, the second metal pattern and the fifth metal pattern respectively occupy different metal layers of the metal layers.

19. The integrated circuit device as claimed in claim 1, further comprising:
   a second capacitor disposed between the substrate and the first capacitor.

20. The integrated circuit device as claimed in claim 19, wherein the second capacitor is a metal-oxide-semiconductor (MOS) varactor or a first metal-oxide-semiconductor (MOS) capacitor.

* * * * *